(12) United States Patent
Lewis et al.

(10) Patent No.: US 11,733,154 B2
(45) Date of Patent: Aug. 22, 2023

(54) THERMAL INTERFACE MATERIAL DETECTION THROUGH COMPRESSION

(71) Applicant: INTERNATIONAL BUSINESS MACHINES CORPORATION, Armonk, NY (US)

(72) Inventors: Theron Lee Lewis, Rochester, MN (US); John R. Dangler, Rochester, MN (US); David J. Braun, St. Charles, MN (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 17/445,098

(22) Filed: Aug. 16, 2021

(65) Prior Publication Data

US 2023/0048273 A1 Feb. 16, 2023

(51) Int. Cl.
*G01N 19/00* (2006.01)
*H05K 7/20* (2006.01)
*H05K 1/02* (2006.01)

(52) U.S. Cl.
CPC ........... *G01N 19/00* (2013.01); *H05K 1/0203* (2013.01); *H05K 7/2039* (2013.01)

(58) Field of Classification Search
CPC ..... G01N 19/00; H05K 1/0203; H05K 7/2039
See application file for complete search history.

(56) References Cited

U.S. PATENT DOCUMENTS

| | | | |
|---|---|---|---|
| 6,294,408 B1 | 9/2001 | Edwards | |
| 6,491,426 B1 | 12/2002 | Schonath | |
| 6,886,976 B2 | 5/2005 | Gaasch | |
| 6,923,570 B2 | 8/2005 | Shih | |
| 7,186,020 B2 * | 3/2007 | Taya | G01K 1/16 257/53 |
| 7,204,298 B2 * | 4/2007 | Hodes | H01L 23/473 257/E23.098 |
| 7,387,747 B2 * | 6/2008 | Taya | G01K 1/16 977/785 |
| 7,764,069 B2 * | 7/2010 | Gaynes | G01B 7/08 324/662 |
| 8,350,263 B2 * | 1/2013 | Oda | H01L 24/92 257/713 |
| 8,440,312 B2 | 5/2013 | Elahee | |
| 8,589,102 B2 | 11/2013 | Chainer et al. | |
| 9,316,603 B2 * | 4/2016 | Megarity | G01N 25/18 |

(Continued)

FOREIGN PATENT DOCUMENTS

EP 3372995 A1 9/2018

*Primary Examiner* — Peter Dungba Vo
*Assistant Examiner* — Jose K Abraham
(74) *Attorney, Agent, or Firm* — Tihon Poltavets

(57) ABSTRACT

An apparatus for thermal interface material detection includes a heatsink stack up with a heatsink, a thermal interface material, a heat generating component, and a printed circuit board. The heatsink is disposed on the thermal interface material, the thermal interface material is disposed on the heat generating component, and the heat generating component is disposed on the printed circuit board. A channel in a body of the heatsink is configured for insertion of a compression probe, where a first end of the channel leads to a lower surface of the body of the heatsink and a second end of the channels leads to an upper surface of the body of the heatsink.

12 Claims, 7 Drawing Sheets

(56) References Cited

U.S. PATENT DOCUMENTS

| | | | |
|---|---|---|---|
| 9,435,759 B2 | 9/2016 | Megarity | |
| 10,041,894 B1 | 8/2018 | Alam | |
| 10,043,730 B2 * | 8/2018 | Refai-Ahmed | H01L 24/72 |
| 10,461,015 B2 * | 10/2019 | Cola | G01R 31/2896 |
| 10,565,899 B1 * | 2/2020 | Dignam | G09B 23/16 |
| 11,029,475 B2 * | 6/2021 | Patel | H01L 23/055 |
| 11,112,841 B2 * | 9/2021 | Mani | H01L 23/552 |
| 2005/0150887 A1 * | 7/2005 | Taya | B82Y 10/00 |
| | | | 219/548 |
| 2019/0364695 A1 * | 11/2019 | Lee | G06F 1/1658 |
| 2020/0066614 A1 * | 2/2020 | Cola | C09K 5/14 |
| 2020/0135611 A1 * | 4/2020 | Czaplewski-Campbell | H01L 23/42 |

* cited by examiner

THERMAL INTERFACE MATERIAL DETECTION THROUGH COMPRESSION

BACKGROUND

This disclosure relates generally to thermal interface material detection, and in particular, to detecting thermal interface material between a heatsink and mounting surface.

A central processing unit (CPU) is an example of a heat generating component with electronic circuitry that processes and executes instructions in nearly all electronic devices, where certain CPU applications often include a heatsink to dissipate the heat generated by a corresponding CPU. When mounting a heatsink to the CPU, a thermal interface material (TIM) can be utilized to provide thermal coupling between the heat generating components and heat dissipating components, where heat generated by the CPU is transferred to the heatsink for dissipation via the thermal interface material. In a high-volume manufacturing setting, verification of thermal interface material can be performed with a visual test or a potentially destructive disassembly of the heatsink stack up.

SUMMARY

One aspect of an embodiment of the present invention discloses an apparatus for thermal interface material detection, the apparatus comprising a heatsink stack up includes a heatsink, a thermal interface material, a heat generating component, and a printed circuit board. The apparatus further comprises the heatsink disposed on the thermal interface material, the thermal interface material disposed on the heat generating component, and the heat generating component disposed on the printed circuit board. The apparatus further comprises a channel in a body of the heatsink configured for insertion of a compression probe, wherein a first end of the channel leads to a lower surface of the body of the heatsink and a second end of the channels leads to an upper surface of the body of the heatsink.

Another aspect of an embodiment of the present invention discloses a method for detecting the presence of thermal interface material, the method comprising providing a heatsink stack up, wherein the heatsink stack up includes a heatsink disposed on a thermal interface material, and the thermal interface material disposed on a heat generating component. The method further comprises placing the heatsink stack up assembly on a support structure. The method further comprises placing a compression probe into a channel on the heatsink, wherein a first end of the channel is positioned at a top surface of a body of the heatsink and a second end of the channel is positioned at a lower surface of the body of the heatsink. The method further comprises initializing the compression probe to generate a compression force curve. The method further comprises verifying the presences of the thermal interface material based on the generated compression force curve.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Figure 1:
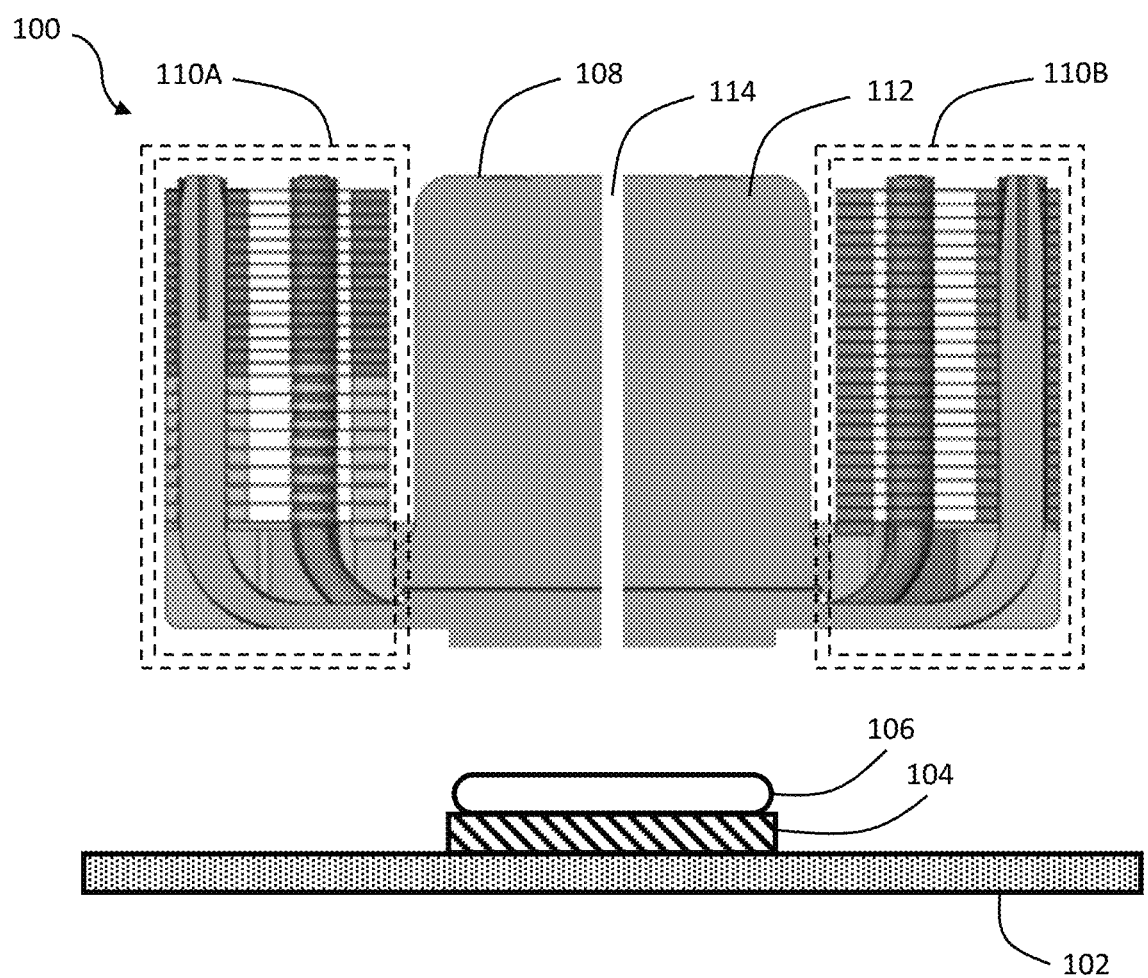
FIG. 1 depicts a side cutaway view of a heatsink with a probing channel prior to mounting to a heat generating component, in accordance with an embodiment of the present invention.

Embodiments of the present invention provide a heatsink with a channel for insertion of a compression probe and a process for detecting thermal interface material positioned between the heatsink and a heat generating component (e.g., central processing unit). The heatsink is disposed on a top surface of the heat generating component, where the thermal interface material is positioned between a lower surface of the heatsink and the top surface of the heat generating component to provide thermal coupling. Presently, a common issue in high volume manufacturing is that thermal interface material can be imprecisely applied between the heatsink and the heat generating component unit or missed altogether, resulting in insufficient thermal coupling. Due to the size of the heatsink and a thickness of the thermal interface material applied to the top surface of the heat generating component, a visual verification after assembly of the heatsink stack up is difficult. For example, if thermal grease is utilized as a thermal interface material, a visual verification is performed by inspecting the sides of a heatsink or plate for seepage. If thermal issues are found subsequent to assembly, the visual verification is difficult without physically removing the heatsink or cold plate and is prone to human error due to the nature of visual verifications.

Certain process-related solutions, such as, pre-kitting the components prior to assembly of the heatsink stack up are also prone to errors and do not provide verification of the thermal interface material between the heatsink and the heat generating component. Assessing a height of the heatsink stack up provides an inaccurate verification of thermal interface material due to the tolerances on the heatsink dimensions and stack up, where the small thickness of the thermal interface material and the tolerances hide the dimensions for the thermal interface thickness. Monitoring thermal performance during an operational test can provide a partial solution via a detection of a heat dissipation issue but does not provide the verification of the presences of thermal interface material. As a result, the verification of the presences of thermal interface material is typically performed utilizing a potentially destructive and costly disassembly of the heatsink stack up.

Embodiments of the present invention utilize a compression probe that includes a sensitive load cell for measuring compression forces as a function of distance. Upon completion of assembly, the heatsink stack up is placed on a support platform to ensure minimal strain and to prevent mechanical damage. The compression probe is disposed in the channel and a leading end of the compression probe contacts the thermal interface material positioned underneath the heatsink, where compression force versus compression distance data is collected by the compression probe. Through multiple iterations utilizing various assembles and various thermal interface material types, various data is collected for future comparison to assist in verifying whether thermal interface material is present between the heatsink and the heat generating component in the heatsink stack up. The data can include material properties and how a specific material compresses under force and an amount of compression can indicate a thickness of the thermal interface material. Through the multiple iterations it is possible to verify if the heatsink is fully actuated onto the thermal interface material. Furthermore, a level of heatsink actuation defines how much thermal interface material enters the channel of the heatsink. Subsequent to the verification of the thermal interface material in the heatsink stack up, the channel can be filled with a metal and/or additional thermal interface material.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FIG. 1 depicts a side cutaway view of a heatsink with a probing channel prior to mounting to a heat generating component, in accordance with an embodiment of the present invention. In this embodiment, heatsink stack up 100 includes printed circuit board 102 with heat generating component 104 disposed on printed circuit board 102. A central processing unit (CPU), also known as a processor, is an example of heat generating component 104 disposed on printed circuit board 102 that requires heat dissipation when operational. Thermal interface material 106 is disposed on a top surface of heat generating component 104, where thermal interface material 106 provides thermal coupling between heat generating component 104 and heatsink 108 (i.e., heat dissipating component). Thermal interface material 106 is any material (solid, grease, and/or gel) that is inserted between two components to enhance thermal coupling between the two components. Heatsink 108 includes fin assembly 110A and 110B each positioned on a side of body 112, where fin assembly 110A and 110B each includes a plurality of fins and heat pipes for dissipating heat from heat generating component 104.

Heatsink 108 is modified to include channel 114 situated between a top surface of body 112 and a bottom surface of body 112 of heatsink 108, where channel 114 is a pass-through between the top surface and the bottom surface of body 112. In this embodiment, FIG. 1 illustrates a cutaway of heatsink 108 with channel 114, where the channel 114 is positioned in the center of body 112 aligned with a center of heat generating component 104. In another embodiment, channel 114 is located offset to the center of heat generating component 104, where a compression probe can measure compression of thermal interface material 106 on an edge of a top surface of heat generating component 104 for verification. In yet another embodiment, body 112 of heatsink 108 includes multiple channels 114, where a compression probe can measure compression of thermal interface material 106 at multiple locations on a top surface of heat generating component 104 for verification.

Figure 2:
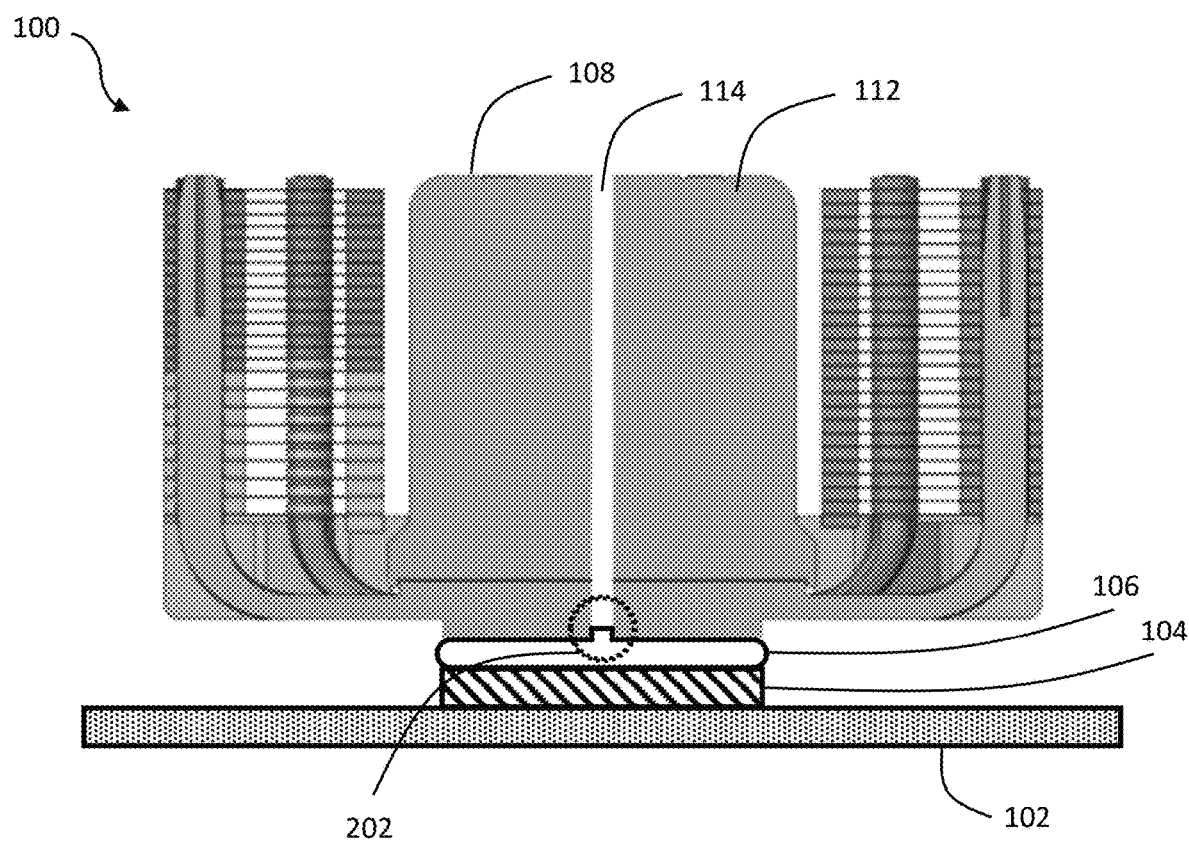
FIG. 2 depicts a side cutaway view of a heatsink with a probing channel mounted on a heat generating component, in accordance with an embodiment of the present invention.

FIG. 2 depicts a side cutaway view of a heatsink with a probing channel mounted on a heat generating component, in accordance with an embodiment of the present invention. In this embodiment, heatsink stack up 100 includes heatsink 108 in a final position on heat generating component 104, where thermal interface material 106 thermally couples body 112 of heatsink 108 to heat generating component 104. As heatsink 108 is pressed onto thermal interface material 106 disposed on a top surface of heat generating component 104 on printed circuit board 102, thermal interface material 106 compresses under the weight and force exerted by a lower surface of body 112 of heatsink 108. As thermal interface material 106 compresses under heatsink 108, a height of thermal interface material 106 decreases and thermal interface material 106 further spreads to cover a greater area of the top surface of heat generating component 104. An amount of thermal interface material 106 utilized is such that the spreading does not exceed the area of the top surface of heat generating component 104 to avoid spill over onto the side of heat generating component 104 and/or printed circuit board 102. Furthermore, as thermal interface material 106 compresses under heatsink 108, a portion of thermal interface material 106 flows into a first end of channel 114 in area 202. In another embodiment, a second end of channel 114 is temporarily capped a creating an air pocket within channel 114 which prevents the portion of thermal interface material 106 from flowing into the first end of channel 114, where the temporary cap is removed subsequent to heatsink 108 being pressed onto heat generating component 104. In yet another embodiment, an entire length of channel 114 is temporarily capped to prevent the portion of thermal interface material 106 from flowing into the first end of channel 114, where the temporary cap is removed subsequent to heatsink 108 being pressed onto heat generating component 104.

Figure 3:
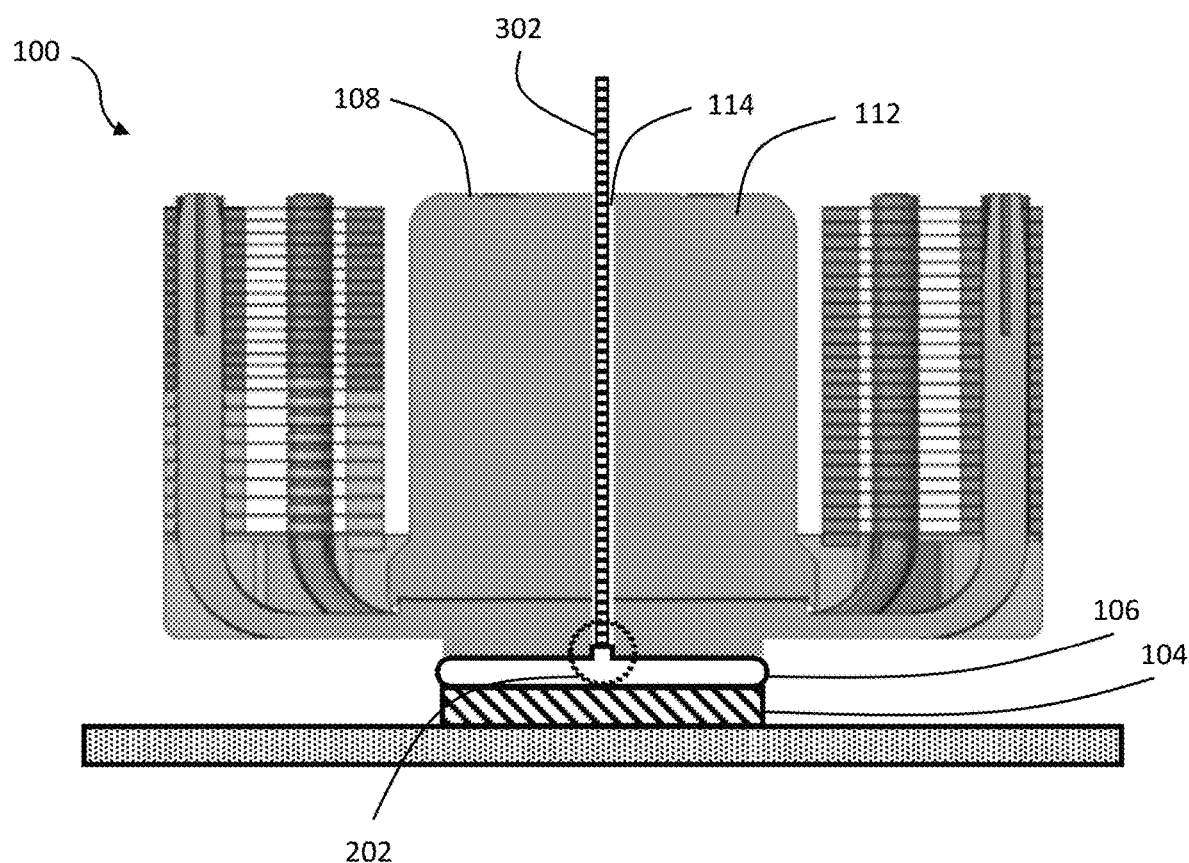
FIG. 3 depicts a side cutaway view of a probing tool in a probing channel of a heatsink mounted on a heat generating component, in accordance with an embodiment of the present invention.

FIG. 3 depicts a side cutaway view of a probing tool in a probing channel of a heatsink mounted on a heat generating component, in accordance with an embodiment of the present invention. In this embodiment, heatsink stack up 100 includes heatsink 108 in a final position on heat generating component 104, where compression probe 302 is disposed inside channel 114 of body 112 of heatsink 108. A first end of compression probe presses into thermal interface material 106 located in area 202, where the compression probe can capture data that includes a force of compression as a function of distance. It is to be noted, though not illustrated in FIG. 3, heatsink stack up 100 can be placed on a support platform to ensure minimal strains and to prevent mechanical damage to the various components. In this embodiment, thermal interface material 106 is present on the top surface of heat generating component 104 and therefore, a curve of force of compression as a function of distance as captured by compression probe 302 will be representative of thermal interface material 106 being compressed. In another embodiment, is thermal interface material 106 is not present on the top surface of heat generating component 104, the first end of compression probe contacts the top surface of the heat generating component 104. The resulting curve of force compression as a function of distance as captured by compression probe 302 will be representative of the top surface of heat generating component 104 being compressed.

In another embodiment, thermal interface material 106 is not present in the first end of channel 114 within area 202 due to a temporary cap being utilized during the assembly process. With multiple iterations of utilizing compression probe 302 for thermal interface material 106 verification, various compression curves can be established representing various heatsink stack ups 100 and various types of thermal interface materials 106. For example, compression curves can be established for each type of thermal interface material 106 and through the various compression curves, it can be determined whether heatsink 108 is fully actuated onto thermal interface material 106. An amount of thermal interface material 106 entering area 202 can be defined depending on a level of heatsink 108 actuation. A slower progression of a compression force applied by compression probe 302 results in a better resolution for the captured data of force of compression as a function of distance. Additionally, the slower compression can prevent damage to the top surface of heat generating component 104 if an initial compression curve is representative of thermal interface material 106 not being present.

Figure 4A:
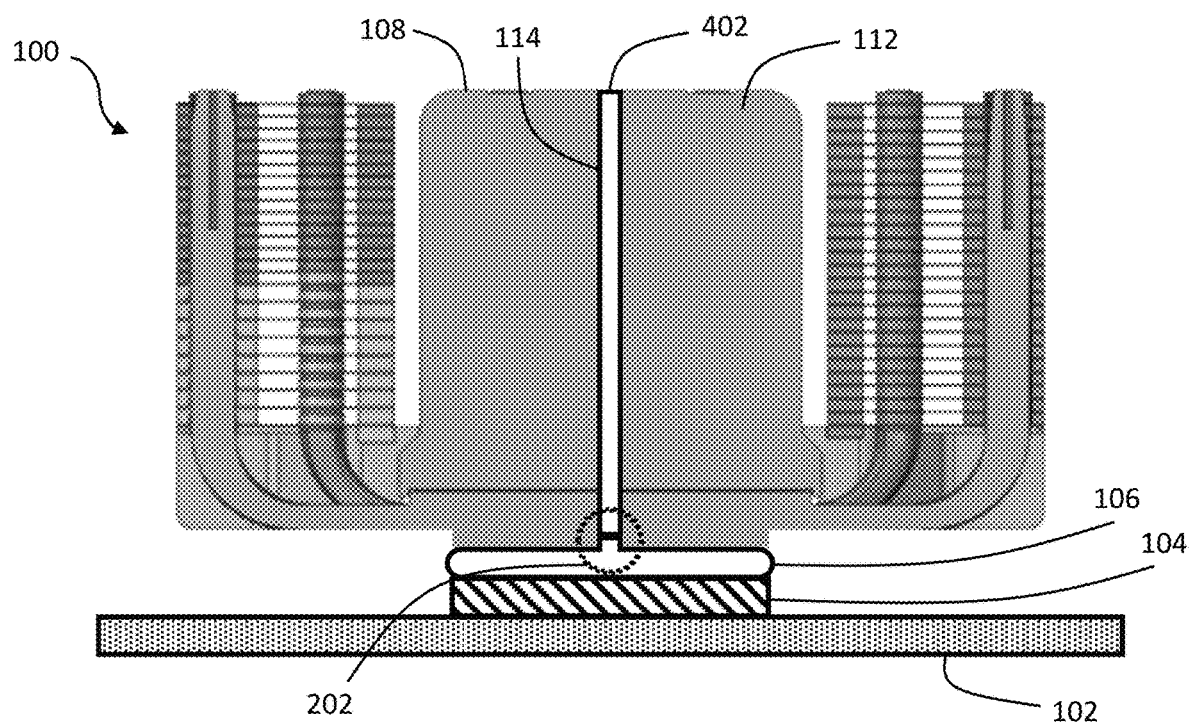
FIG. 4A depicts a side cutaway view of a heatsink with a thermal interface material filled probing channel mounted on a heat generating component, in accordance with an embodiment of the present invention.

FIG. 4A depicts a side cutaway view of a heatsink with a thermal interface material filled probing channel mounted on a heat generating component, in accordance with an embodiment of the present invention. In this embodiment, subsequent to verification of thermal interface material 106 being present between body 112 of heatsink 108 and heat generating component 104 on printed circuit board 102, filler thermal interface material 402 is injected into channel 114. Filler thermal interface material 402 is injected down channel 114 onto thermal interface material 106 in area 202 and filled to the second end of channel 114 towards a top surface of body 112 of heatsink 108. Similar to thermal interface material 106, filler thermal interface material 402 can be a solid, grease, and/or gel. Heatsink stack up 100 as illustrated in FIG. 4A illustrates a completed assembly with a verified presence of properly positioned thermal interface material 106 between heatsink 108 and heat generating component 104.

Figure 4B:
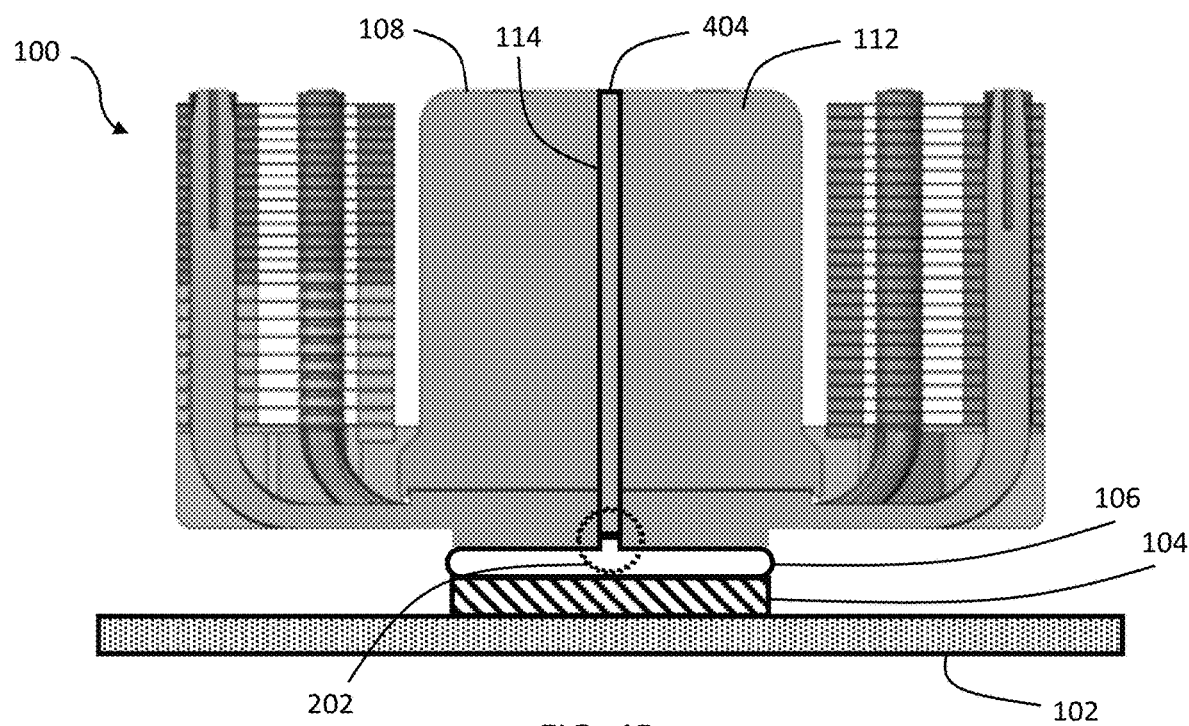
FIG. 4B depicts a side cutaway view of a heatsink with a metal filled probing channel mounted on a heat generating component, in accordance with an embodiment of the present invention.

FIG. 4B depicts a side cutaway view of a heatsink with a metal filled probing channel mounted on a heat generating component, in accordance with an embodiment of the present invention. In this embodiment, subsequent to verification of thermal interface material 106 being present between body 112 of heatsink 108 and heat generating component 104 on printed circuit board 102, filler thermal interface material 402 is injected into channel 114. Metal plug 404 is disposed into channel 114 onto thermal interface material 106 in area 202, where metal plug 404 is positioned from thermal interface material 106 to a second end of channel 114 towards a top surface of body 112 of heatsink 108. Heatsink stack up 100 as illustrated in FIG. 4B illustrates a completed assembly with a verified presence of properly positioned thermal interface material 106 between heatsink 108 and heat generating component 104.

The terminology used herein is for the purpose of describing particular embodiments only and is not intended to be limiting to the invention. As used herein, the singular forms "a", "an" and "the" are intended to include the plural forms as well, unless the context clearly indicates otherwise.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

Figure 5:
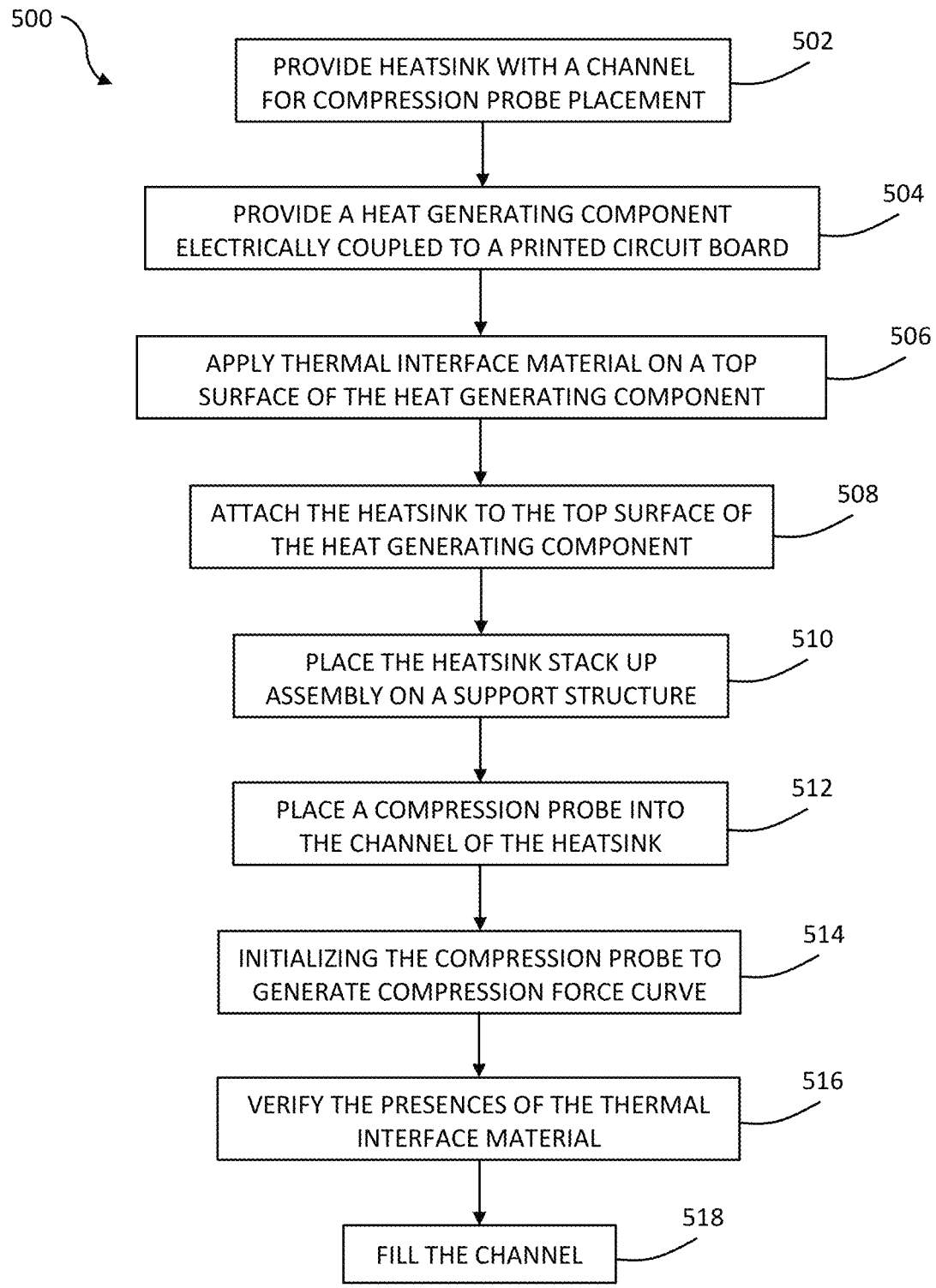
FIG. 5 depicts a process for verifying presence of thermal interface material utilizing a compression probe, in accordance with an embodiment of the present invention.

FIG. 5 depicts a process for verifying presence of thermal interface material utilizing a compression probe, in accordance with an embodiment of the present invention. Detection process 500 represents a thermal interface material (TIM) verification process for a heatsink stack up assembly, where the thermal interface material thermally couples a heat dissipating component (e.g., heatsink, coldplate) and a heat generating component (e.g., central processing unit (CPU)). Detection process 500 includes providing a heatsink with a channel for compression probe placement (502). The heatsink provided is as described with regards to FIGS. 1-4B, where the heatsink includes one or more channel for placement of compression probe. The heatsink can be molded with the one or more channels and/or the heatsink can be drilled to create the one or more channels, where each channel is a pass-through from a top surface to a bottom surface of a body of the heatsink. Detection process 500 further includes providing a heat generating component electrically coupled to a printed circuit board (504) and applying a thermal interface material on a top surface of the heat generating component (506). The thermal interface material can be a solid, grease, and/or gel, and is meant to be compressive to 50% or more of an initially applied thickness and spreadable on the top surface of the heat generating component.

Detection process 500 further includes attaching the heatsink to the top surface of the heat generating component (508) and placing the heatsink stack up assembly on a support structure. Attaching the heatsink to the top surface of the heat generating component includes compressing the thermal interface material applied (i.e., disposed) to the top surface of the heat generating component. As mentioned above, the thermal interface material should compress by 50% or more of the initially applied thickness and the thermal interface material should lift into a first end of the channel in the heatsink. The heatsink stack up assembly is placed on the support structure to ensure minimal strain and to prevent mechanical damage to one or more components of the heatsink stack up assembly.

Detection process 500 further includes placing a compression probe into the channel of the heatsink (512) and initializing the compression probe to generate a compression force curve (514). The compression probe is placed into the channel of the heatsink until a first end of the compression probe contacts matter either thermal interface material or the top surface of the heat generating component. Initializing the compression probe allows for the compression probe to provide a slow compression force to generate the compression force curve illustrating a compression force versus compression distance. Detection process 500 further includes verifying the presences of the thermal interface material (516) and filling the channel (518). The generated compression force curve is compared to one or more known compression curves for the thermal interface material being utilized in the heatsink stack up assembly. If the generated compression force curve matches a known compression curve, the presence of the thermal interface material is verified. If the generated compression force curve does not match a known compression curve, the presence of the thermal interface material is not verified. Subsequent to the verification, the channel in the heatsink is filled with a metal plug and/or addition thermal interface material.

Figure 6:
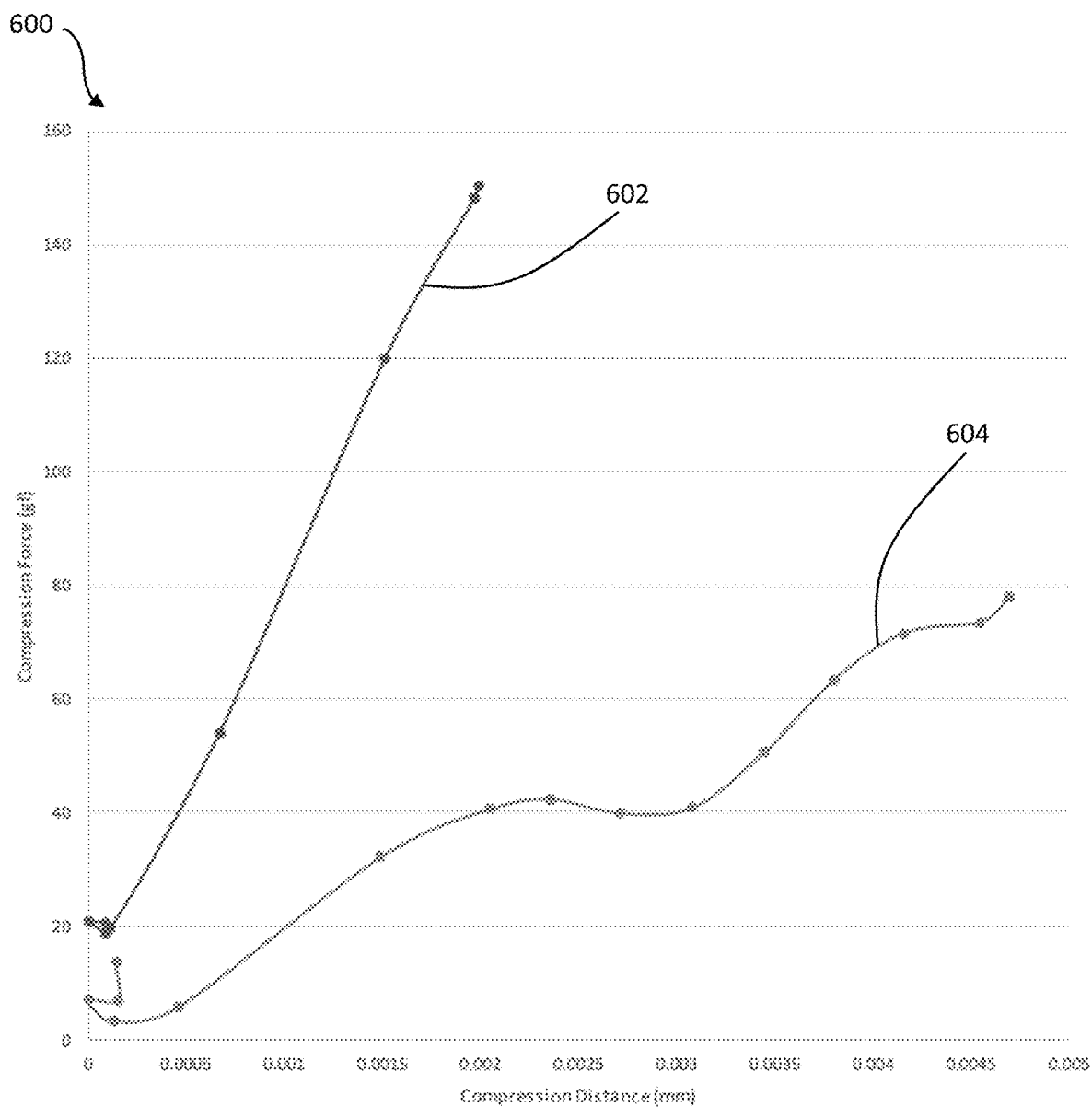
FIG. 6 depicts example compression readings based on force applied to a thermal interface material and a top surface of a heat generating component, in accordance with an embodiment of the present invention.

FIG. 6 depicts example compression readings based on force applied to a thermal interface material and a top surface of a central processing unit, in accordance with an embodiment of the present invention. Compression curves 600 includes two compression force versus compression distance plots, where no TIM curve 602 represents compression on a surface with no thermal interface material (e.g., top surface of a heat generating component) and TIM curve 604 represents compression of Indium thermal interface material disposed between a heatsink and a heat generating component of a heatsink stack up assembly. No TIM curve 602 illustrates a steep rise of compression force versus compression distance, since the top surface of the heat generating component is less malleable when compared to Indium thermal interface material. TIM curve 602 illustrates a progressive rise of compression force versus compression distance, since the malleable Indium thermal interface material compresses under the applied force of the compression probe.

Figure 7:
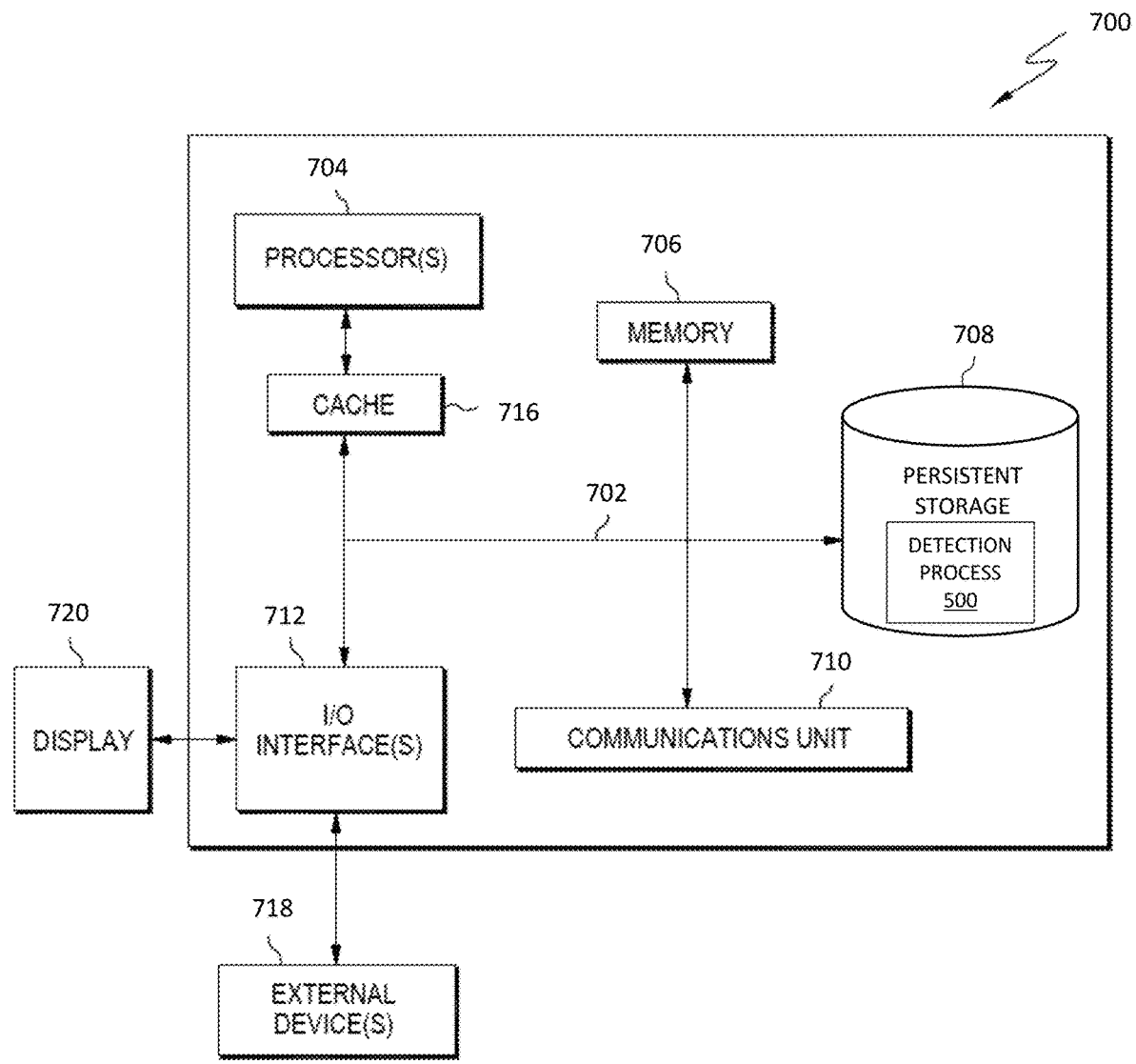
FIG. 7 is a block diagram of components of a computer system for performing a thermal interface material detection process, in accordance with an embodiment of the present invention

FIG. 7 depicts computer system 700 that can include a program stored in persistence storage 708 for performing detection process 500 in an automated manufacturing environment. The computer system includes processors 704, cache 716, memory 706, persistent storage 708, communications unit 710, input/output (I/O) interface(s) 712 and communications fabric 702. Communications fabric 702 provides communications between cache 716, memory 706, persistent storage 708, communications unit 710, and input/output (I/O) interface(s) 712. Communications fabric 702 can be implemented with any architecture designed for passing data and/or control information between processors (such as microprocessors, communications and network processors, etc.), system memory, peripheral devices, and any other hardware components within a system. For example, communications fabric 702 can be implemented with one or more buses or a crossbar switch.

Memory 706 and persistent storage 708 are computer readable storage media. In this embodiment, memory 706 includes random access memory (RAM). In general, memory 706 can include any suitable volatile or non-volatile computer readable storage media. Cache 716 is a fast memory that enhances the performance of processors 704 by holding recently accessed data, and data near recently accessed data, from memory 706.

Program instructions and data used to practice embodiments of the present invention may be stored in persistent storage 708 and in memory 706 for execution by one or more of the respective processors 704 via cache 716. In an embodiment, persistent storage 708 includes a magnetic hard disk drive. Alternatively, or in addition to a magnetic hard disk drive, persistent storage 708 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 708 may also be removable. For example, a removable hard drive may be used for persistent storage 708. Other examples include optical and magnetic disks, thumb drives, and smart cards that are inserted into a drive for transfer onto another computer readable storage medium that is also part of persistent storage 708.

Communications unit 710, in these examples, provides for communications with other data processing systems or devices. In these examples, communications unit 710 includes one or more network interface cards. Communications unit 710 may provide communications through the use of either or both physical and wireless communications links. Program instructions and data used to practice embodiments of the present invention may be downloaded to persistent storage 708 through communications unit 710.

I/O interface(s) 712 allows for input and output of data with other devices that may be connected to each computer system. For example, I/O interface 712 may provide a connection to external devices 718 such as a keyboard, keypad, a touch screen, and/or some other suitable input device. External devices 718 can also include portable computer readable storage media such as, for example, thumb drives, portable optical or magnetic disks, and memory cards. Software and data used to practice embodiments of the present invention can be stored on such portable computer readable storage media and can be loaded onto persistent storage 708 via I/O interface(s) 712. I/O interface(s) 712 also connect to display 720.

Display 720 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
providing a heatsink stack up, wherein the heatsink stack up includes a heatsink disposed on a thermal interface material, and the thermal interface material disposed on a heat generating component;

placing the heatsink stack up assembly on a support structure;

placing a compression probe into a channel on the heatsink, wherein a first end of the channel is positioned at a top surface of a body of the heatsink and a second end of the channel is positioned at a lower surface of the body of the heatsink;

initializing the compression probe to generate a compression force curve; and verifying the presences of the thermal interface material based on the generated compression force curve.

2. The method of claim 1, wherein providing the heatsink stack up further comprises:

providing the heatsink with the channel for a placement of the compression probe;

providing the heat generating component electrically coupled to a printed circuit board;

applying the thermal interface material to a top surface of the heat generating component; and attaching the heatsink to the top surface of the heat generating component.

3. The method of claim 2, wherein the thermal interface material is compressed between the lower surface of the body of the heatsink and the top surface of the heat generating component.

4. The method of claim 1, wherein the compression force curve is a measure of compression forces as a function of distance.

5. The method of claim 1, further comprising:

comparing one or more known compression force curves for the thermal interface material in the heatsink stack up.

6. The method of claim 1, further comprising:

filling the channel with another thermal interface material.

7. The method of claim 1, further comprising:

filling the channel with a metal plug.

8. The method of claim 1, wherein a first end of the compression probe contacts the thermal interface material disposed on the heat generating component.

9. The method of claim 1, wherein a first end of the compression probe contacts a portion of the thermal interface material disposed in the first end of the channel.

10. The method of claim 1, wherein the supporting structure supports a printed circuit board with the heatsink, the thermal interface material, and the heat generating component.

11. The method of claim 1, wherein the heat generating component is a central processing unit.

12. The method of claim 1, wherein the thermal interface material is selected from the group consisting of: a solid, a grease, and a gel.

* * * * *